US012716935B2

(12) United States Patent
Wendler

(10) Patent No.: US 12,716,935 B2
(45) Date of Patent: Aug. 25, 2026

(54) TEST AND/OR MEASUREMENT DEVICE WITH NOISE FIGURE FUNCTIONALITY, AND CORRESPONDING METHOD

(71) Applicant: Rohde & Schwarz GmbH & Co. KG, Munich (DE)

(72) Inventor: Wolfgang Wendler, Groebenzell (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 159 days.

(21) Appl. No.: 18/891,846

(22) Filed: Sep. 20, 2024

(65) Prior Publication Data

US 2026/0086139 A1 Mar. 26, 2026

(51) Int. Cl.
*G01R 31/28* (2006.01)
*G01R 13/02* (2006.01)
*G01R 31/00* (2006.01)

(52) U.S. Cl.
CPC ..... *G01R 31/2822* (2013.01); *G01R 13/0245* (2013.01); *G01R 31/001* (2013.01)

(58) Field of Classification Search
USPC .......................................................... 324/500
See application file for complete search history.

(56) References Cited

U.S. PATENT DOCUMENTS 9,939,479 B2 4/2018 Ballo et al.
10,718,804 B2 7/2020 Sariaslani et al.
11,424,841 B1 * 8/2022 Mohindra .......... H04B 17/0085
11,815,540 B2 11/2023 Iwai

* cited by examiner

*Primary Examiner* — Farhana A Hoque
(74) *Attorney, Agent, or Firm* — DITTHAVONG, STEINER & MLOTKOWSKI

(57) ABSTRACT

A test and/or measurement device with noise figure functionality is provided, comprising a port for connecting the test and/or measurement device to a device under test, DUT, wherein a radio frequency, RF, signal is receivable and/or received from the DUT at said port, a measurement unit connected to said port, and configured to receive the RF signal from the port, to demodulate the RF signal into an in-phase-, I-, component and a quadrature-, Q-, component, and to digitize said I-component and said Q-component, a processing unit connected to said measurement unit, and configured to receive the correspondingly digitized I-component and the correspondingly digitized Q-component from the measurement unit, and to calculate phase noise based on the digitized I-component and the digitized Q-component, a display unit connected to said processing unit, and an input unit connected to said processing unit. The processing unit is configured to display the correspondingly calculated phase noise as a phase noise graph on the display unit. Furthermore, the processing unit is configured to receive an input information from the input unit, to display a marker element on the display unit based on the correspondingly received input information, and to calculate, especially to calculate and display, a respective noise figure of the DUT based on a corresponding actual position of the marker element on the display unit.

20 Claims, 6 Drawing Sheets

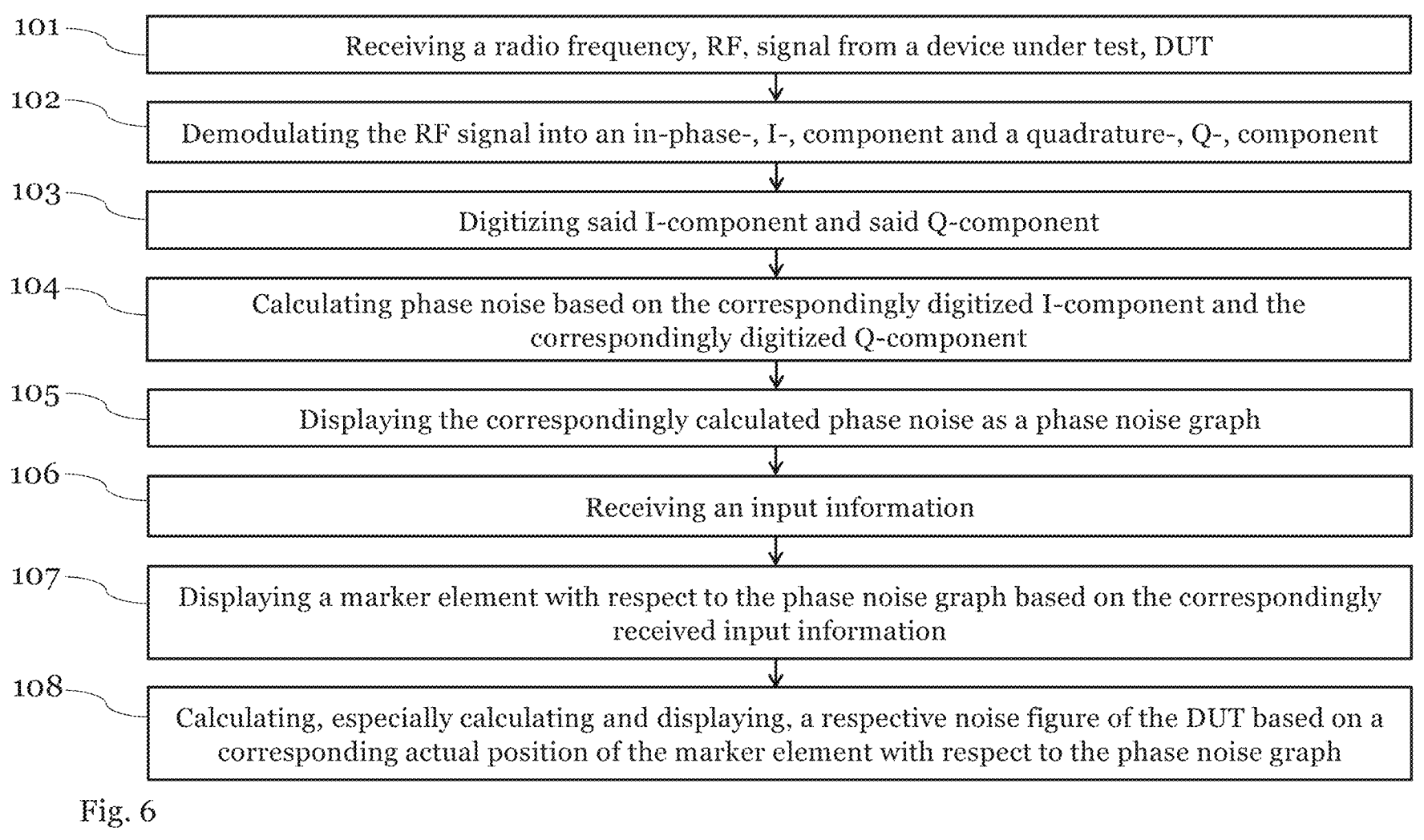

101 Receiving a radio frequency, RF, signal from a device under test, DUT

102 Demodulating the RF signal into an in-phase-, I-, component and a quadrature-, Q-, component 103 Digitizing said I-component and said Q-component 104 Calculating phase noise based on the correspondingly digitized I-component and the correspondingly digitized Q-component 105 Displaying the correspondingly calculated phase noise as a phase noise graph 106 Receiving an input information 107 Displaying a marker element with respect to the phase noise graph based on the correspondingly received input information 108 Calculating, especially calculating and displaying, a respective noise figure of the DUT based on a corresponding actual position of the marker element with respect to the phase noise graph

Fig. 6

TEST AND/OR MEASUREMENT DEVICE WITH NOISE FIGURE FUNCTIONALITY, AND CORRESPONDING METHOD

TECHNICAL FIELD

The present disclosure relates to a test and/or measurement device with noise figure functionality and a test and/or measurement method with noise figure functionality.

BACKGROUND ART

Noise figure measurements are very important in many different applications, especially to optimize such applications in the sense of efficiency and reliability. Typically, such noise figure measurements are complex and expensive, which leads to inefficiencies and an error-proneness.

For instance, U.S. Pat. No. 9,939,479 B2 discloses a method of determining a noise figure (NF) response of a device under test (DUT), which comprises determining a frequency response of a noise receiver over a first frequency range, measuring a gain of the DUT over a second frequency range encompassing the first frequency range, measuring output-noise power of the DUT over the second frequency range, determining an estimated gain of the DUT based on the frequency response of the noise receiver and the gain of the DUT over the first frequency range, and determining the NF response of the DUT over the second frequency range based on the estimated gain and the output-noise power.

Furthermore, U.S. Pat. No. 11,815,540 B2 relates to a receiver is for measuring the output noise of a DUT. The receiver includes an input port configured to connect to an output of the DUT, first and second measurement channels, and a cross-correlation circuit. The first measurement channel includes a first amplifier, a first mixer, a first local oscillator (LO), and a first analog-to-digital converter (ADC). The second measurement channel includes a second amplifier, a second mixer, a second local oscillator (LO), and a second analog-to-digital converter (ADC). A second LO frequency is different than a first LO frequency. The cross-correlation circuit is configured to cross-correlate sample values obtained from the first and second measurement channels to obtain the output noise of the DUT.

Moreover, U.S. Pat. No. 10,718,804 B2 discloses a system for measuring residual phase noise of a DUT, which includes first and second signal sources, first and second receivers, and a processor. The first signal source generates a first signal to be input to the DUT as a stimulus signal and provides a second signal that is phase coherent with the first signal. The second signal source receives the second signal and generates a reference signal based on the second signal, which is phase coherent with the stimulus signal. The first receiver measures an output signal from the DUT responsive to the stimulus signal, and the second receiver measures the reference signal from the second signal source. The processor mathematically suppresses a carrier of the output signal by determining a difference between the measured output signal and the measured reference signal, and determines the residual phase noise of the DUT based on the difference.

SUMMARY

Thus, there is a need to provide an improved test and/or measurement device with noise figure functionality and an improved test and/or measurement method with noise figure functionality.

This is achieved by the embodiments provided in the enclosed independent claims. Advantageous implementations of the present disclosure are further defined in the dependent claims.

According to a first aspect of the present disclosure, a test and/or measurement device with noise figure functionality is provided. Said test and/or measurement device comprises a port for connecting the test and/or measurement device to a device under test, DUT, wherein a radio frequency, RF, signal is receivable and/or received from the DUT at said port, a measurement unit connected to said port, and configured to receive the RF signal from the port, to demodulate the RF signal into an in-phase-, I-, component and a quadrature-, Q-, component, and to digitize said I-component and said Q-component, a processing unit connected to said measurement unit, and configured to receive the correspondingly digitized I-component and the correspondingly digitized Q-component from the measurement unit, and to calculate phase noise based on the digitized I-component and the digitized Q-component, a display unit connected to said processing unit, and an input unit connected to said processing unit. In this context, the processing unit is configured to display the correspondingly calculated phase noise as a phase noise graph on the display unit. In addition to this, the processing unit is configured to receive an input information from the input unit, to display a marker element on the display unit based on the correspondingly received input information, and to calculate, especially to calculate and display, a respective noise figure of the DUT based on a corresponding actual position of the marker element on the display unit.

Advantageously, a particularly high efficiency and reliability can be achieved. Further advantageously, it is neither necessary to know the corresponding gain of the DUT nor to provide any noise source.

With respect to the test and/or measurement device, it is noted that it might be particularly advantageous if the test and/or measurement device comprises or is a phase noise tester.

With respect to the above-mentioned noise figure, it is noted that it might be particularly advantageous if said noise figure is calculated in accordance with the following formula:

$$NF = PN + 177\frac{\text{dBm}}{\text{Hz}} + P_{in},$$

wherein NF denotes the noise figure, wherein PN denotes the corresponding phase noise, especially at wide offset, preferably wherein wideband noise is dominating, and wherein $P_{in}$ denotes the corresponding input power with respect to the DUT.

Furthermore, with respect to the following implementation forms, it is noted that each of said implementation forms further improves the test and/or measurement device especially in the sense of efficiency and/or reliability.

According to an implementation form of the first aspect of the present disclosure, the processing unit is further configured to perform a phase demodulation based on the digitized I-component and the digitized Q-component, to transfer a result of the phase demodulation from a time domain into a frequency domain, and to calculate a phase noise based on the correspondingly transferred result of the phase demodulation.

According to an implementation form of the first aspect of the present disclosure, the processing unit is further configured to subsequently receive new input information from the input unit, to subsequently update a corresponding position of the marker element on the display unit based on the new input information, and to subsequently calculate a respective new noise figure of the DUT based on the correspondingly updated position of the marker element on the display unit.

According to an implementation form of the first aspect of the present disclosure, the marker element is configured to be associable and/or associated with a specific part of the phase noise graph. In addition to this or as an alternative, the processing unit is further configured to calculate a respective noise figure of the DUT for said specific part of the phase noise graph associated with the marker element.

According to an implementation form of the first aspect of the present disclosure, the marker element is configured to mark a specific frequency of the phase noise graph. In addition to this or as an alternative, the processing unit is further configured to calculate a respective noise figure of the DUT based on a corresponding position of the marker element in a wide-band noise area of the phase noise graph.

According to an implementation form of the first aspect of the present disclosure, the marker element comprises or is a cursor, an arrow, a vertical line, a horizontal line, an enclosed area, or any combination thereof.

According to an implementation form of the first aspect of the present disclosure, the marker element is configured such that a color of the marker element differs from a color of the phase noise graph. As an alternative, the marker element is configured such that the marker element and the phase noise graph have the same color.

According to an implementation form of the first aspect of the present disclosure, the marker element is configured such that the marker element is arranged in close distance to the phase noise graph. As an alternative, the marker element is configured such that the marker element at least partly overlaps the phase noise graph.

According to an implementation form of the first aspect of the present disclosure, the input unit comprises or is a user input, a keyboard, a mouse, at least one knob, at least one turning wheel, a touch screen, touch screen information, or any combination thereof.

According to an implementation form of the first aspect of the present disclosure, the display unit comprises or is a display arranged at or in the test and/or measurement device. In addition to this or as an alternative, the display unit comprises or is a display arranged at or in a webserver instance.

According to an implementation form of the first aspect of the present disclosure, the measurement unit comprises an I/Q mixing unit with a first mixer and a second mixer, wherein an input port of the I/Q mixing unit is connected to the port, wherein the measurement unit further comprises a first analog-to-digital converter and a second analog-to-digital converter, wherein the first mixer is connected to the first analog-to-digital converter, wherein the second mixer is connected to the second analog-to-digital converter, wherein an output of the first analog-to-digital converter is connected to the processing unit, and wherein an output of the second analog-to-digital converter is connected to the processing unit.

According to an implementation form of the first aspect of the present disclosure, the measurement unit further comprises a first amplifier arranged between the first mixer and the first analog-to-digital converter. In addition to this or as an alternative, the measurement unit further comprises a second amplifier arranged between the second mixer and the second analog-to-digital converter. Additionally or alternatively, the measurement unit further comprises an attenuator arranged between the port and the I/Q mixing unit. Further additionally or further alternatively, the measurement unit further comprises a bandpass filter arranged between the port and the I/Q mixing unit.

According to an implementation form of the first aspect of the present disclosure, the test and/or measurement device and/or the measurement unit further comprises a signal generator configured to generate a test signal, said test signal especially being feedable to the DUT, wherein the first mixer and the second mixer are configured to receive the test signal as local oscillator, LO, signal, wherein the second mixer especially receives a 90 degrees phase shift of the test signal.

According to an implementation form of the first aspect of the present disclosure, the signal generator is arranged in the same housing as the measurement unit and/or the processing unit. As an alternative, the signal generator is arranged in a separate housing external to a housing of the measurement unit and/or the processing unit.

According to an implementation form of the first aspect of the present disclosure, the test and/or measurement device further comprises a further measurement unit connected to the port and arranged in parallel to the measurement unit, wherein the further measurement unit is configured to receive the RF signal from the port, to demodulate the RF signal into a further I-component and a further Q-component, and to digitize the further I-component and the further Q-component.

According to an implementation form of the first aspect of the present disclosure, the processing unit is configured to receive the correspondingly digitized further I-component and the correspondingly digitized further Q-component from the further measurement unit.

According to an implementation form of the first aspect of the present disclosure, the processing unit is configured to cross-correlate and/or average a complex result or Fourier transformed complex result based on the I-component and the Q-component with a complex conjugated further result based on the further I-component and the further Q-component.

According to an implementation form of the first aspect of the present disclosure, the complex result comprises or is a vector. In addition to this or as an alternative, the complex conjugated further result comprises or is a vector.

According to an implementation form of the first aspect of the present disclosure, the port comprises or is a test and/or measurement port. In addition to this or as an alternative, the measurement unit comprises or is measurement circuitry and/or a demodulator. Additionally or alternatively, the processing unit comprises or is a processor.

According to a second aspect of the present disclosure, a test and/or measurement method with noise figure functionality, especially using a test and/or measurement device according to the first aspect of the present disclosure or any of its implementation forms, respectively, is provided. Said test and/or measurement method comprises the steps of receiving a radio frequency, RF, signal from a device under test, DUT, demodulating the RF signal into an in-phase-, I-, component and a quadrature-, Q-, component, digitizing said I-component and said Q-component, calculating phase noise based on the correspondingly digitized I-component and the correspondingly digitized Q-component, displaying the correspondingly calculated phase noise as a phase noise graph, receiving an input information, displaying a marker element with respect to the phase noise graph based on the correspondingly received input information, and calculating, especially calculating and displaying, a respective noise figure of the DUT based on a corresponding actual position of the marker element with respect to the phase noise graph.

Advantageously, a particularly high efficiency and reliability can be achieved. Further advantageously, it is neither necessary to know the corresponding gain of the DUT nor to provide any noise source.

With respect to the above-mentioned noise figure, it is noted that it might be particularly advantageous if said noise figure is calculated in accordance with the following formula:

$$NF = PN + 177\frac{\text{dBm}}{\text{Hz}} + P_{in},$$

wherein NF denotes the noise figure, wherein PN denotes the corresponding phase noise, especially at wide offset, and wherein $P_{in}$ denotes the corresponding input power with respect to the DUT.

The above and/or below description with regard to the test and/or measurement device according to the first aspect of the present disclosure can be correspondingly valid for the test and/or measurement method according to the second aspect of the present disclosure, and vice versa.

BRIEF DESCRIPTION OF THE DRAWINGS

The above-described aspects and implementation forms of the present disclosure will be explained in the following description of specific embodiments in relation to the enclosed drawings, in which:

FIG. 6 shows a flow diagram of an embodiment of a test and/or measurement method with noise figure functionality.

DETAILED DESCRIPTIONS OF EMBODIMENTS

It is generally noted that in the following, for the sake of brevity, analogous parts or elements, respectively, in different figures are equipped with the same reference signs rather than explicitly explained again.

Figure 1:
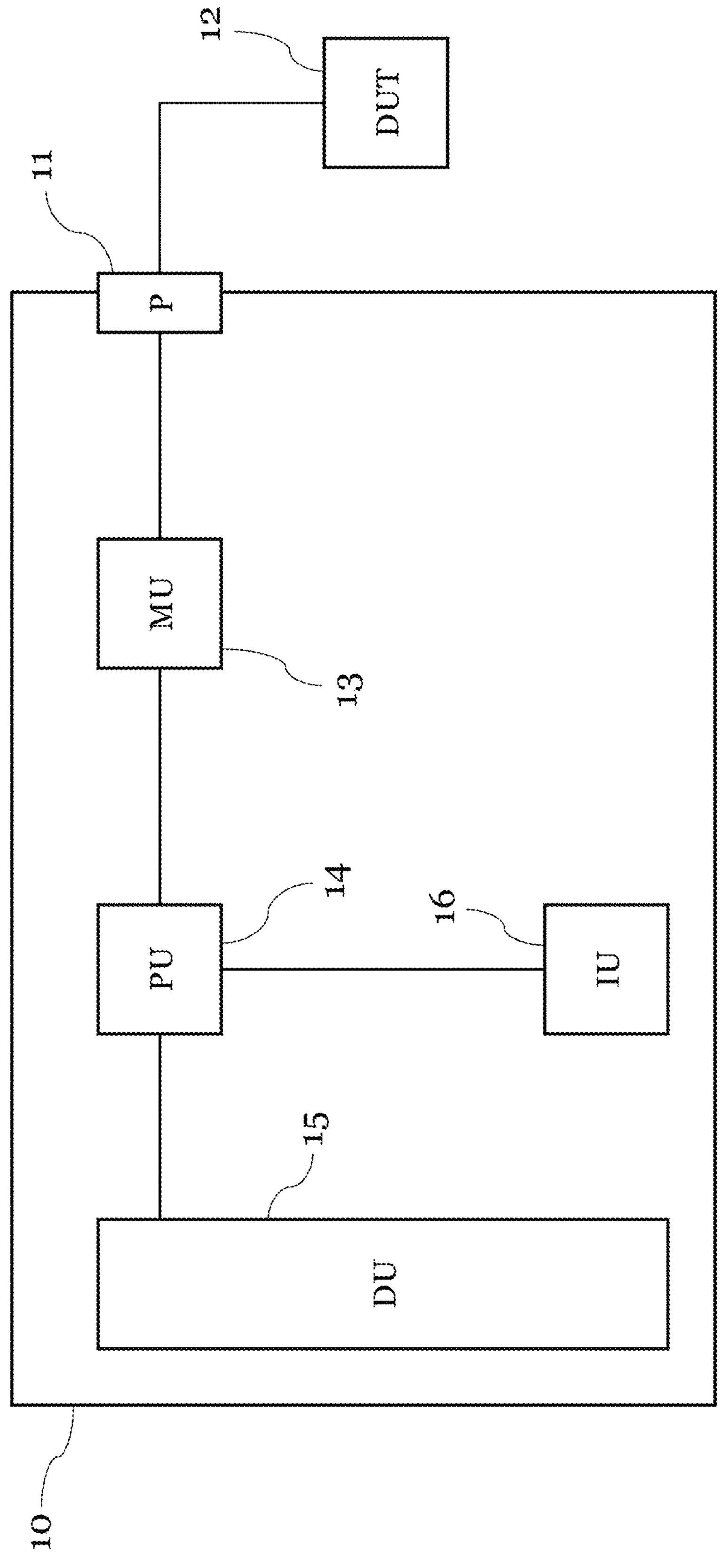
FIG. 1 shows a block diagram of an embodiment of a test and/or measurement device with noise figure functionality.

FIG. 1 shows an embodiment of a test and/or measurement device 10 with noise figure functionality. Said test and/or measurement device 10 comprises a port 11 for connecting the test and/or measurement device 10 to a device under test, DUT, 12 wherein a radio frequency, RF, signal is receivable and/or received from the DUT 12 at said port 11, a measurement unit 13 connected to said port 11, and configured to receive the RF signal from the port 11, to demodulate the RF signal into an in-phase-, I-, component and a quadrature-, Q-, component, and to digitize said I-component and said Q-component, a processing unit 14 connected to said measurement unit 13, and configured to receive the correspondingly digitized I-component and the correspondingly digitized Q-component from the measurement unit 13, and to calculate phase noise based on the digitized I-component and the digitized Q-component, a display unit 15 connected to said processing unit 14, and an input unit 16 connected to said processing unit 14.

In this context, the processing unit 14 is configured to display the correspondingly calculated phase noise as a phase noise graph on the display unit 15. In addition to this, the processing unit 14 is configured to receive an input information from the input unit 16, to display a marker element on the display unit 15 based on the correspondingly received input information, and to calculate, especially to calculate and display, a respective noise figure of the DUT 12 based on a corresponding actual position of the marker element on the display unit 15.

It is noted that it might be particularly advantageous if the processing unit 14 is further configured to perform a phase demodulation based on the digitized I-component and the digitized Q-component, to transfer a result of the phase demodulation from a time domain into a frequency domain, and to calculate a phase noise based on the correspondingly transferred result of the phase demodulation.

It is further noted that it might be particularly advantageous if the processing unit 14 is further configured to subsequently receive new input information from the input unit 16, to subsequently update a corresponding position of the marker element on the display unit 15 based on the new input information, and to subsequently calculate a respective new noise figure of the DUT 12 based on the correspondingly updated position of the marker element on the display unit 15.

With respect to the maker element, it is noted that it might be particularly advantageous if the marker element is configured to be associable and/or associated with a specific part of the phase noise graph. In addition to this or as an alternative, the processing unit 14 may further be configured to calculate a respective noise figure of the DUT 12 for said specific part of the phase noise graph associated with the marker element.

Furthermore, the marker element can be configured to mark a specific frequency of the phase noise graph. Additionally or alternatively, the processing unit 14 may further be configured to calculate a respective noise figure of the DUT 12 based on a corresponding position of the marker element in a wide-band noise area of the phase noise graph.

Moreover, it is noted that it might be particularly advantageous if the marker element comprises or is a cursor, an arrow, a vertical line, a horizontal line, an enclosed area, or any combination thereof. For instance, said enclosed area can comprise or be a rectangular shaped area, a triangle shaped area, a multangular shaped area, or any combination thereof.

It is further noted that it might be particularly advantageous if the marker element is configured such that a color of the marker element differs from a color of the phase noise graph. As an alternative, the marker element can be configured such that the marker element and the phase noise graph have the same color. For instance, especially for the case that the test and/or measurement device 10 is configured to test and/more measure different DUTs, preferably at different ports, same color is beneficial if different phase noise graphs from different DUTs or ports, respectively, are shown simultaneously.

Furthermore, it might be particularly advantageous if the marker element is configured such that the marker element is arranged in close distance to the phase noise graph. As an alternative, the marker element can be configured such that the marker element at least partly overlaps the phase noise graph.

With respect to the input unit 16, it is noted that it might be particularly advantageous if the input unit 16 comprises or is a user input, a keyboard, a mouse, at least one knob, at least one turning wheel, a touch screen, touch screen information, or any combination thereof.

With respect to the display unit 15, it is noted that it might be particularly advantageous if the display unit 15 comprises or is a display arranged at or in the test and/or measurement device 10. In addition to this or as an alternative, the display unit can comprise or be a display arranged at or in a webserver instance.

With respect to the measurement unit 13, it is noted that it might be particularly advantageous if the measurement unit 13 comprises an I/Q mixing unit with a first mixer and a second mixer, wherein an input port of the I/Q mixing unit is connected to the port 11, wherein the measurement unit 13 further comprises a first analog-to-digital converter and a second analog-to-digital converter, wherein the first mixer is connected to the first analog-to-digital converter, wherein the second mixer is connected to the second analog-to-digital converter, wherein an output of the first analog-to-digital converter is connected to the processing unit 14, and wherein an output of the second analog-to-digital converter is connected to the processing unit 14.

Figure 3:
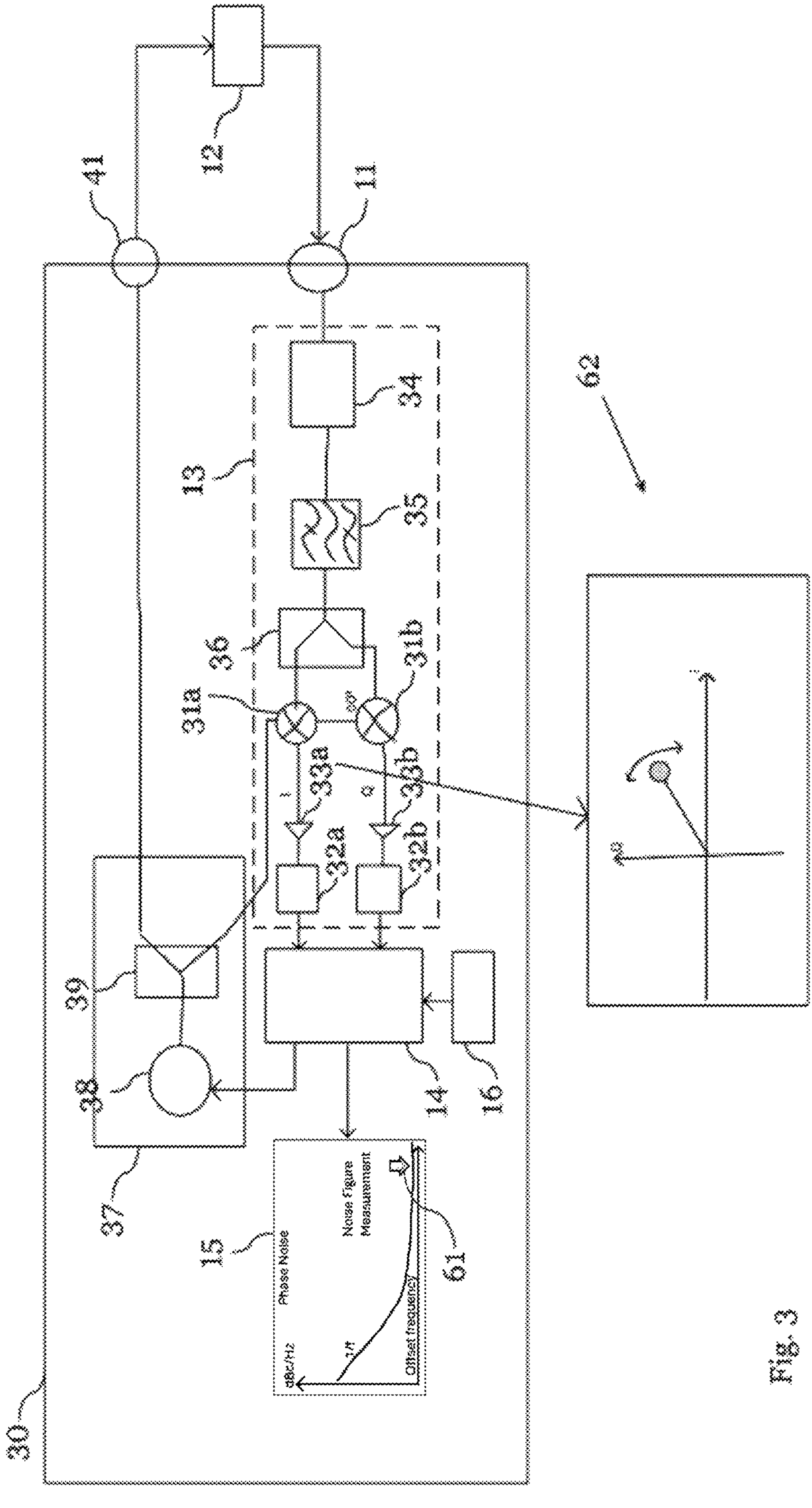
FIG. 3 shows a block diagram of an embodiment of a test and/or measurement device with noise figure functionality.
Figure 4:
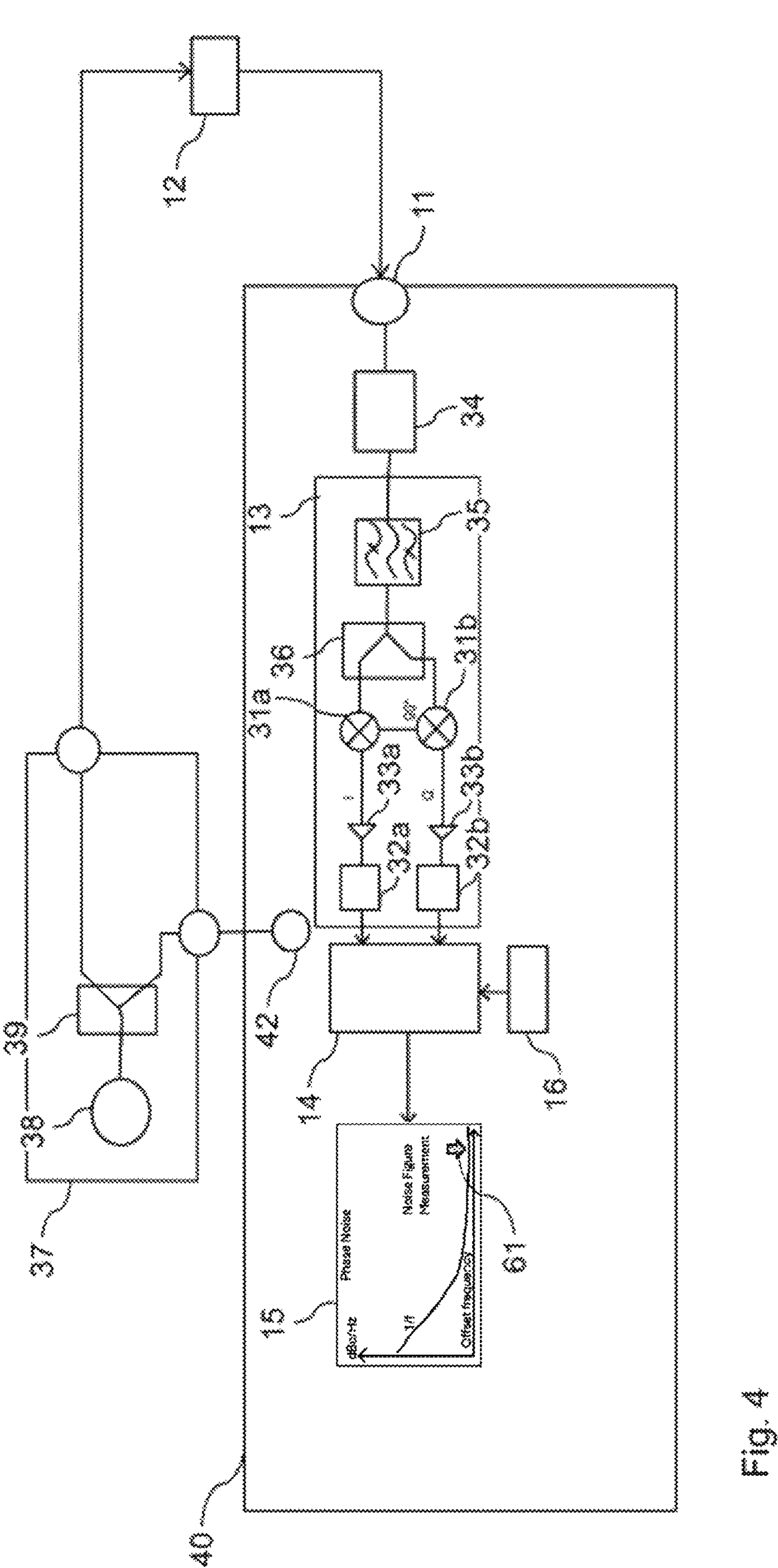
FIG. 4 shows a block diagram of an embodiment of a test and/or measurement device with noise figure functionality.
Figure 5:
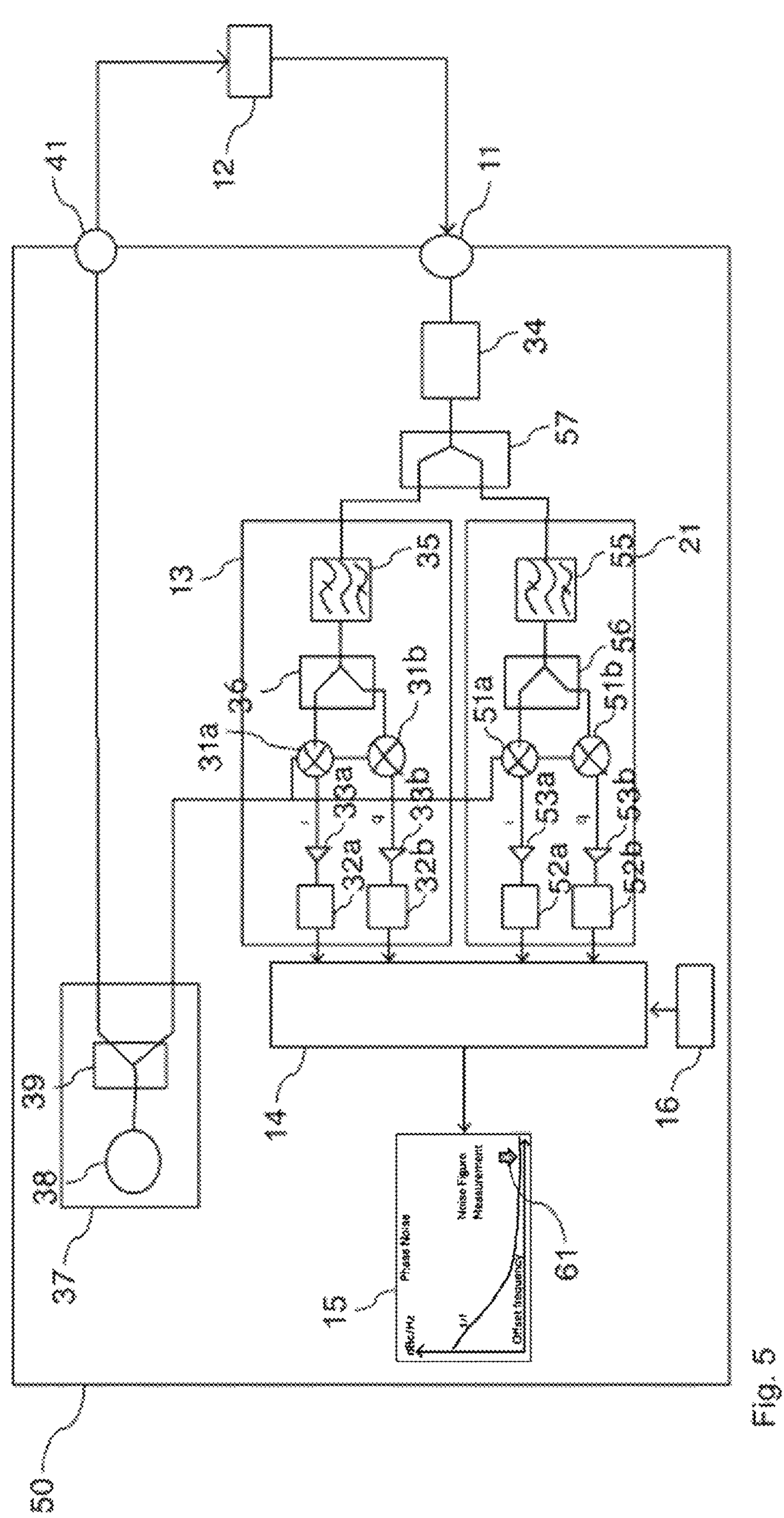
FIG. 5 shows a block diagram of an embodiment of a test and/or measurement device with noise figure functionality and cross correlation.

In advance, with respect to each of the embodiments according to FIG. 3, FIG. 4, and FIG. 5, it is noted that such a first mixer is illustrated as mixer 31*a*, whereas such a second mixer is depicted as mixer 31*b*. Furthermore, such a first analog-to-digital converter is shown as analog-to-digital converter 32*a*, whereas such a second analog-to-digital converter is illustrated as analog-to-digital converter 32*b*. Moreover, with respect to the above-mentioned I/Q mixing unit, it is noted that such an I/Q mixing unit can comprise or be an I/Q mixer.

Again, with respect to the measurement unit 13 of FIG. 1, it is noted that it might be particularly advantageous if the measurement unit 13 further comprises a first amplifier arranged between the first mixer and the first analog-to-digital converter. In addition to this or as an alternative, the measurement unit 13 can further comprise a second amplifier arranged between the second mixer and the second analog-to-digital converter. Additionally or alternatively, the measurement unit 13 can further comprises an attenuator arranged between the port 11 and the I/Q mixing unit. Further additionally or further alternatively, the measurement unit 13 can further comprise a bandpass filter arranged between the port 11 and the I/Q mixing unit.

In advance, with respect to each of the embodiment according to FIG. 3, FIG. 4, and FIG. 5, it is noted that such a first amplifier is depicted as amplifier 33*a*, whereas such a second amplifier is shown as amplifier 33*b*. Furthermore, such an attenuator is illustrated as attenuator 34, whereas such a bandpass filter is shown as bandpass filter 35.

In particular, with respect to FIG. 3, the port 11 of the test and/or measurement device 30 is connected via the attenuator 34, the bandpass filter 35, and a divider or splitter 36, respectively, to the first mixer 31*a* and the second mixer 31*b*. With respect to FIG. 4, the port 11 of the test and/or measurement device 40 is connected via the attenuator 34, the bandpass filter 35, and the divider or splitter 36, respectively, to the first mixer 31*a* and the second mixer 31*b*. In this context, in the case of FIG. 3, the attenuator 34 is part of the measurement unit 13, whereas in the case of FIG. 4, the attenuator 34 is part of the test and/or measurement device 40 but not part of the measurement unit 13. Advantageously, said test and/or measurement device 40 of FIG. 4 can efficiently allow for an attenuator interchangeability. Said advantage can also be achieved by the test and/or measurement device 50 according to FIG. 5, wherein the attenuator 34 is part of the test and/or measurement device 50 but not part of the measurement unit 13. In the case of FIG. 5, the port 11 is connected via the attenuator 34, a divider or splitter 57, respectively, of the test and/or measurement device 50, the bandpass filter 35 of the measurement unit 13, the divider or splitter 36, respectively, to the first mixer 31*a* and the second mixer 31*b*.

Furthermore, also with respect to each of the test and/or measurement devices 30, 40, 50, it is noted that it might be particularly advantageous if the test and/or measurement device 30, 40, 50 and/or the measurement unit 13 further comprises a signal generator 37 configured to generate a test signal, said test signal especially being feedable to the DUT 12, wherein the first mixer 31*a* and the second mixer 31*b* are configured to receive the test signal as local oscillator, LO, signal, wherein the second mixer 31*b* especially receives a 90 degrees phase shift of the test signal.

For instance, said signal generator 37 comprises a signal source 38 and a divider or splitter 39, respectively, being especially fed by the signal source 38. In particular, the test and/or measurement device 30 of FIG. 3 comprises the signal generator 37 and a further port 41, wherein the DUT 12 is fed by the signal generator 37, especially by the divider or splitter 39, respectively, thereof, via the further port 41, and the mixers 31*a*, 31*b* are also fed by the signal generator 37, especially by the divider or splitter 39, respectively, thereof. This can analogously apply for the test and/or measurement device 50 according to FIG. 5.

In the case of said FIG. 3 and said FIG. 5, the signal generator 37 is exemplarily arranged in the same housing as the measurement unit 13 and the processing unit 14. As an alternative, as illustrated by the test and/or measurement device 40 according to FIG. 4, the signal generator 37 can be arranged in a separate housing external to a housing of the measurement unit 13 and the processing unit 14. Exemplarily, in the case of FIG. 4, the test and/or measurement device 40 further comprises a separate port 42, wherein via said separate port 42, the mixers 31*a*, 31*b* can be fed by the test signal from the signal generator 37, especially from the divider or splitter 39, respectively, thereof.

Figure 2:
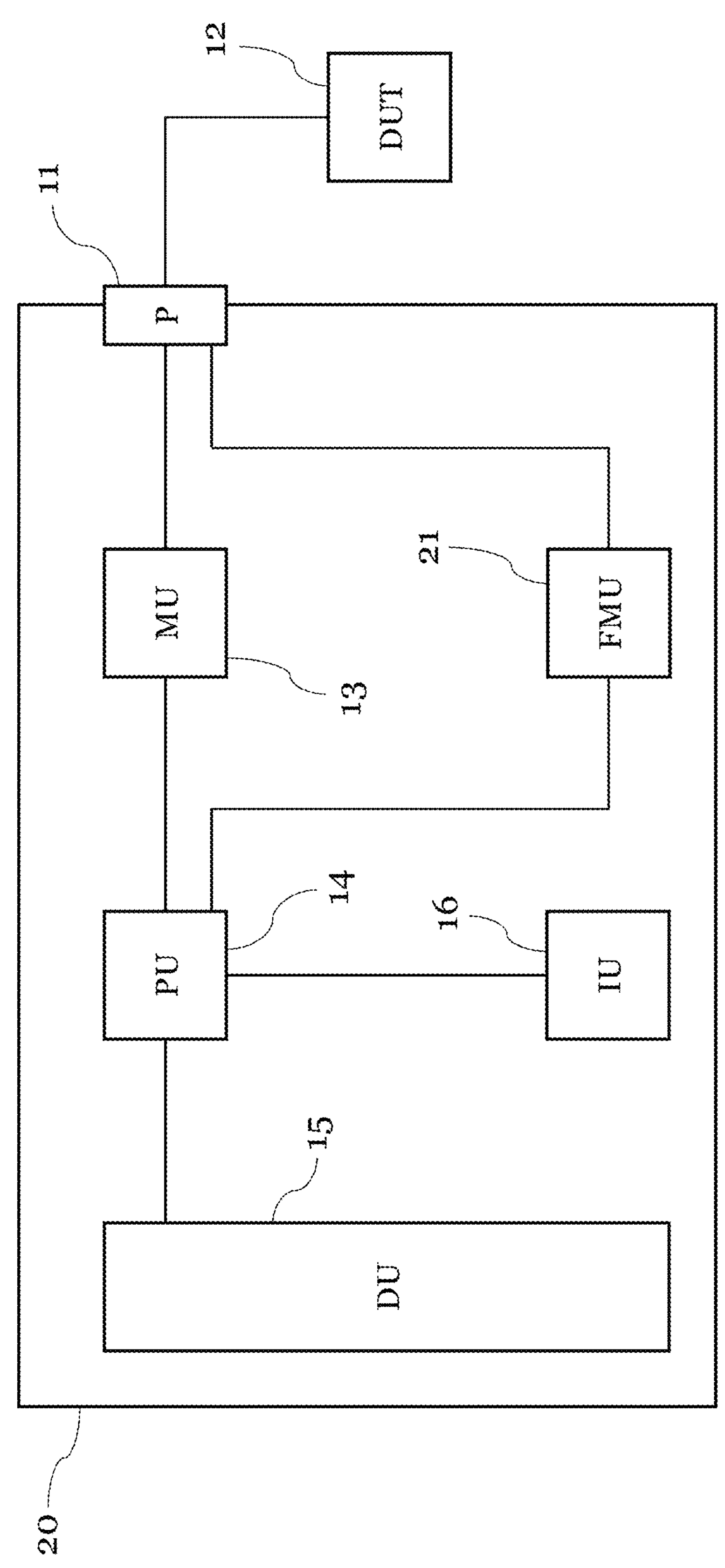
FIG. 2 shows a block diagram of an embodiment of a test and/or measurement device with noise figure functionality.

Now, with respect to FIG. 2, a test and/or measurement device 20 is illustrated, which differs from the test and/or measurement device 10 of FIG. 1 especially in that the test and/or measurement device 20 further comprises a further measurement unit 21 connected to the port 11 and arranged in parallel to the measurement unit 13, wherein the further measurement unit 21 is configured to receive the RF signal from the port 11, to demodulate the RF signal into a further I-component and a further Q-component, and to digitize the further I-component and the further Q-component.

As it can further be seen from said FIG. 2, the processing unit 14 is exemplarily configured to receive the correspondingly digitized further I-component and the correspondingly digitized further Q-component from the further measurement unit 21.

It is noted that it might be particularly advantageous if the processing unit 14 is configured to cross-correlate and/or average a complex result based on the I-component and the Q-component with a complex conjugated further result based on the further I-component and the further Q-component.

Furthermore, it is noted that it might be particularly advantageous if the complex result comprises or is a vector. Additionally or alternatively, it might be particularly advantageous if the complex conjugated further result comprises or is a vector.

Moreover, it might be particularly advantageous if the measurement unit 13 and the further measurement unit 21 are based on equivalent elements as illustrated by the test and/or measurement device 50 of FIG. 5. In this context, the elements 31*a*, 31*b*, 32*a*, 32*b*, 33*a*, 33*b*, 35, 36 of the measurement unit 13 are exemplarily equivalent to the elements 51*a*, 51*b*, 52*a*, 52*b*, 53*a*, 53*b*, 55, 56 of the further measurement unit 21. Accordingly, the above-mentioned divider or splitter 57, respectively, of the test and/or measurement device 50 feeds the bandpass filter 55 of the further measurement unit 21 in addition to the bandpass filter 35 of the measurement unit 13. By analogy, the signal generator 37, especially the divider or splitter 39, respectively, thereof, feeds the mixers 51*a*, 51*b* of the further measurement unit 21 in addition to the mixers 31*a*, 31*b* of the measurement unit 13.

With respect to the above-mentioned marker element, it is noted that with respect to each of the test and/or measurement devices 30, 40, 50 according to FIG. 3, FIG. 4, FIG. 5, such a marker element is illustrated as marker element 61, exemplarily in the form of an arrow. In addition to this, FIG. 3 illustrates additive/residual phase noise of the DUT 12 in the context of an I/Q representation 62.

Furthermore, with respect to the port 11, it is noted that it might be particularly advantageous if the port 11 comprises or is a test and/or measurement port. With respect to the measurement unit 13, it is noted that it might be particularly advantageous if the measurement unit 13 comprises or is measurement circuitry and/or a demodulator. With respect to the further measurement unit 21, it is noted that it might be particularly advantageous if the further measurement unit 21 comprises or is measurement circuitry and/or a demodulator. With respect to the processing unit 14, it is noted that it might be particularly advantageous if the processing unit 14 comprises or is a processor.

Finally, FIG. 6 illustrates a flow chart of an embodiment of a test and/or measurement method with noise figure functionality. It is noted that it might be particularly advantageous if said method uses a test and/or measurement device such as one of the above-mentioned test and/or measurement devices 10, 20, 30, 40, 50.

In accordance with said FIG. 6, a first step 101 of said method comprises receiving a radio frequency, RF, signal from a device under test, DUT. A second step 102 comprises demodulating the RF signal into an in-phase-, I-, component and a quadrature-, Q-, component. A third step 103 comprises digitizing said I-component and said Q-component. A fourth step 104 comprises calculating phase noise based on the correspondingly digitized I-component and the correspondingly digitized Q-component. A fifth step 105 comprises displaying the correspondingly calculated phase noise as a phase noise graph, especially as a phase noise graph in frequency domain. A sixth step 106 comprises receiving an input information. A seventh step 107 comprises displaying a marker element with respect to the phase noise graph based on the correspondingly received input information. An eighth step 108 comprises calculating, especially calculating and displaying, a respective noise figure of the DUT based on a corresponding actual position of the marker element with respect to the phase noise graph.

In particular, with respect to the above-mentioned phase noise graph in the frequency domain, it is noted that I and Q signals are signals in the time domain and said signals can be demodulated, e.g. to measure amplitude modulation, phase modulation or frequency modulation. The demodulated signal may then be Fourier transformed and displayed logarithmically in the frequency domain, which may especially be understood as said phase noise graph in the frequency domain.

All features described above or features shown in the figures can be combined with each other in any advantageous manner within the scope of the disclosure.

What is claimed is:

1. A test and/or measurement device with noise figure functionality, comprising:

a port for connecting the test and/or measurement device to a device under test, DUT, wherein a radio frequency, RF, signal is receivable and/or received from the DUT at said port, a measurement unit connected to said port, and configured to receive the RF signal from the port, to demodulate the RF signal into an in-phase-, I-, component and a quadrature-, Q-, component, and to digitize said I-component and said Q-component, a processing unit connected to said measurement unit, and configured to receive the correspondingly digitized I-component and the correspondingly digitized Q-component from the measurement unit, and to calculate phase noise based on the digitized I-component and the digitized Q-component, a display unit connected to said processing unit, and an input unit connected to said processing unit, wherein the processing unit is configured to display the correspondingly calculated phase noise as a phase noise graph on the display unit, and wherein the processing unit is configured to receive an input information from the input unit, to display a marker element on the display unit based on the correspondingly received input information, and to calculate, especially to calculate and display, a respective noise figure of the DUT based on a corresponding actual position of the marker element on the display unit.

2. The test and/or measurement device according to claim 1, wherein the processing unit is further configured to perform a phase demodulation based on the digitized I-component and the digitized Q-component, to transfer a result of the phase demodulation from a time domain into a frequency domain, and to calculate a phase noise based on the correspondingly transferred result of the phase demodulation.

3. The test and/or measurement device according to claim 1, wherein the processing unit is further configured to subsequently receive new input information from the input unit, to subsequently update a corresponding position of the marker element on the display unit based on the new input information, and to subsequently calculate a respective new noise figure of the DUT based on the correspondingly updated position of the marker element on the display unit.

4. The test and/or measurement device according to claim 1, wherein the marker element is configured to be associable and/or associated with a specific part of the phase noise graph, and/or wherein the processing unit is further configured to calculate a respective noise figure of the DUT for said specific part of the phase noise graph associated with the marker element.

5. The test and/or measurement device according to claim 1, wherein the marker element is configured to mark a specific frequency of the phase noise graph, and/or wherein the processing unit is further configured to calculate a respective noise figure of the DUT based on a corresponding position of the marker element in a wide-band noise area of the phase noise graph.

6. The test and/or measurement device according to claim 1, wherein the marker element comprises or is a cursor, an arrow, a vertical line, a horizontal line, an enclosed area, or any combination thereof.

7. The test and/or measurement device according to claim 1, wherein the marker element is configured such that a color of the marker element differs from a color of the phase noise graph, or wherein the marker element is configured such that the marker element and the phase noise graph have the same color.

8. The test and/or measurement device according to claim 1, wherein the marker element is configured such that the marker element is arranged in close distance to the phase noise graph, or wherein the marker element is configured such that the marker element at least partly overlaps the phase noise graph.

9. The test and/or measurement device according to claim 1, wherein the input unit comprises or is a user input, a keyboard, a mouse, at least one knob, at least one turning wheel, a touch screen, touch screen information, or any combination thereof.

10. The test and/or measurement device according to claim 1, wherein the display unit comprises or is a display arranged at or in the test and/or measurement device, and/or wherein the display unit comprises or is a display arranged at or in a webserver instance.

11. The test and/or measurement device according to claim 1, wherein the measurement unit comprises an I/Q mixing unit with a first mixer and a second mixer, wherein an input port of the I/Q mixing unit is connected to the port, wherein the measurement unit further comprises a first analog-to-digital converter and a second analog-to-digital converter, wherein the first mixer is connected to the first analog-to-digital converter, wherein the second mixer is connected to the second analog-to-digital converter, wherein an output of the first analog-to-digital converter is connected to the processing unit, and wherein an output of the second analog-to-digital converter is connected to the processing unit.

12. The test and/or measurement device according to claim 11, wherein the measurement unit further comprises a first amplifier arranged between the first mixer and the first analog-to-digital converter, and/or wherein the measurement unit further comprises a second amplifier arranged between the second mixer and the second analog-to-digital converter, and/or wherein the measurement unit further comprises an attenuator arranged between the port and the I/Q mixing unit, and/or wherein the measurement unit further comprises a band-pass filter arranged between the port and the I/Q mixing unit.

13. The test and/or measurement device according to claim 11, wherein the test and/or measurement device and/or the measurement unit further comprises a signal generator configured to generate a test signal, said test signal especially being feedable to the DUT, wherein the first mixer and the second mixer are configured to receive the test signal as local oscillator, LO, signal, wherein the second mixer especially receives a 90 degrees phase shift of the test signal.

14. The test and/or measurement device according to claim 13, wherein the signal generator is arranged in the same housing as the measurement unit and/or the processing unit, or wherein the signal generator is arranged in a separate housing external to a housing of the measurement unit and/or the processing unit.

15. The test and/or measurement device according to claim 1, wherein the test and/or measurement device further comprises a further measurement unit connected to the port and arranged in parallel to the measurement unit, wherein the further measurement unit is configured to receive the RF signal from the port, to demodulate the RF signal into a further I-component and a further Q-component, and to digitize the further I-component and the further Q-component.

16. The test and/or measurement device according to claim 15, wherein the processing unit is configured to receive the correspondingly digitized further I-component and the correspondingly digitized further Q-component from the further measurement unit.

17. The test and/or measurement device according to claim 16, wherein the processing unit is configured to cross-correlate and/or average a complex result or Fourier transformed complex result based on the I-component and the Q-component with a complex conjugated further result based on the further I-component and the further Q-component.

18. The test and/or measurement device according to claim 17, wherein the complex result comprises or is a vector, and/or wherein the complex conjugated further result comprises or is a vector.

19. The test and/or measurement device according to claim 1, wherein the port comprises or is a test and/or measurement port, and/or wherein the measurement unit comprises or is measurement circuitry and/or a demodulator, and/or wherein the processing unit comprises or is a processor.

20. A test and/or measurement method with noise figure functionality, especially using a test and/or measurement device according to claim 1, comprising the steps of:

receiving a radio frequency, RF, signal from a device under test, DUT, demodulating the RF signal into an in-phase-, I-, component and a quadrature-, Q-, component, digitizing said I-component and said Q-component, calculating phase noise based on the correspondingly digitized I-component and the correspondingly digitized Q-component, displaying the correspondingly calculated phase noise as a phase noise graph, receiving an input information, displaying a marker element with respect to the phase noise graph based on the correspondingly received input information, and calculating, especially calculating and displaying, a respective noise figure of the DUT based on a corresponding actual position of the marker element with respect to the phase noise graph.

* * * * *